US006404657B1

(12) United States Patent
Mangtani et al.

(10) Patent No.: US 6,404,657 B1
(45) Date of Patent: Jun. 11, 2002

(54) METHOD TO SYNCHRONIZE MULTIPLE SWITCHING REGULATORS IN OUT OF PHASE MODE WITHOUT PLL

(75) Inventors: Vijay R. Mangtani, Sunnyvale; Len Sherman, Los Altos Hills, both of CA (US)

(73) Assignee: Maxim Integrated Products, Sunnyvale, CA (US)

( * ) Notice: Subject to any disclaimer, the term of this patent is extended or adjusted under 35 U.S.C. 154(b) by 0 days.

(21) Appl. No.: 09/976,586

(22) Filed: Oct. 12, 2001

Related U.S. Application Data
(60) Provisional application No. 60/252,060, filed on Nov. 20, 2000.

(51) Int. Cl.[7] .............................................. H02M 1/00
(52) U.S. Cl. ........................................................ 363/72
(58) Field of Search ........................ 363/72, 71; 307/82, 307/38, 39, 40, 41

(56) References Cited

U.S. PATENT DOCUMENTS

| 4,034,232 A | 7/1977 | LaVentura ................... 307/32 |
| 4,190,882 A | 2/1980 | Chevalier et al. .............. 363/26 |
| 5,142,217 A | 8/1992 | Gontowski, Jr. ............. 323/272 |
| 5,847,554 A | 12/1998 | Wilcox et al. ............... 323/282 |
| 6,177,787 B1 | 1/2001 | Hobrecht ..................... 323/283 |
| 6,285,571 B1 * | 9/2001 | Brooks et al. ............... 323/272 |

* cited by examiner

Primary Examiner—Shawn Riley
(74) Attorney, Agent, or Firm—Oppenheimer Wolff & Donnelly, LLP

(57) ABSTRACT

The present invention is a method and apparatus to synchronize multiple switching regulators in out of phase mode without a phase locked loop. In the present invention, each multiple slave device is connected to a master device and to one another in series, as well as connected to a master clock signal. After a DH, LX or DL output from a preceding device is detected by a following connected slave device, the first subsequent edge of a master clock signal serves to reset the internal clock of the slave device. Each slave device in turn, drives a separate power MOSFET pair in out of phase mode, based upon the output of the preceding device and synchronized to the master clock signal. In the case of multiple regulators, synchronization may be used to reduce electronic noise levels or confine noise to known non-sensitive frequency bands.

12 Claims, 2 Drawing Sheets

METHOD TO SYNCHRONIZE MULTIPLE SWITCHING REGULATORS IN OUT OF PHASE MODE WITHOUT PLL

CROSS REFERENCE TO RELATED APPLICATIONS

This Application claims the benefit of U.S. Provisional Application No. 60/252,060, filed Nov. 20, 2000.

STATEMENT REGARDING FEDERALLY SPONSORED RESEARCH

Not applicable.

BACKGROUND OF INVENTION

FIELD OF INVENTION

The present invention is related to synchronization of digital circuits without a phase locked loop (PLL). More specifically, the present invention relates to the method and apparatus of connecting multiple slave devices, for example regulators, such that the slave devices are synchronized in out of phase mode. Synchronizing switching converters in out of phase mode reduces noise and/or confines noise to known frequencies. Noise may be restricted to non-sensitive frequency bands or eliminated through the design and use of effective filters. Operating synchronized converters in this out of phase mode also reduces the ripple current requirement from the power supply feeding the converters.

DESCRIPTION OF RELATED ART

The reduction, elimination or control of noise in electronic systems is a primary concern in design parameters. Noise, which is present in practically every electronic system, tends to limit signal precision and detectability in the electronic system. Electronic noise may be due to several sources and may be classified as one of several types, such as thermal (Johnson) noise, shot noise or flicker noise.

Thermal or Johnson noise is a function of temperature and is due to the random motion of electrons due to thermal agitation. Thermal noise is considered "white noise" since the rms value remains constant for all frequencies. Flicker noise however, is a function of frequency. Due to surface imperfections, electron conductance creates random current fluctuations, which increase at lower frequencies. In any case, the result is voltages or currents which accompany the desired signal and tend to contaminate it.

Solutions to electronic system noise have included the proper grounding of components in which undesired noise is subject to generation, as well as proper shielding of components. However this may only address some of the noise created. To increase the precision of certain electronic systems, greater measures need to be taken. To accomplish this, the characteristics and effects of electronic noise should be taken into account, and system operational solutions considered. Further, if noise can not be entirely eliminated, a method to contain the noise within known frequencies is a desirable alternative.

BRIEF SUMMARY OF THE INVENTION

It is the object of the present invention to create a method and apparatus, which may be used to synchronize multiple slave devices, such as regulators or converters, in out of phase mode without a phase locked loop. Electronic system noise is thereby confined to non-sensitive frequency bands or is eliminated through the design and use of proper filters. The present invention achieves this goal by connecting each multiple slave device to a master device and to one another in series. A master clock signal is connected to each device clock input through a clock bus. The DH pin of the master device is connected to the first slave device $PH_{IN}$ pin and the DH pin of the first slave device is then connected to the $PH_{IN}$ pin of the second slave device. The DH pin of the second slave device is then connected to the $PH_{IN}$ pin of the third slave device and so on, for each slave device.

The internal clock for each slave device is held low until the $PH_{IN}$ pin for the slave device detects a DH or LX output from the previous device. Alternatively, a DL output from the previous device may be used in place of a DH or LX output. For the first slave device, the previous converter will be the master device and for the second slave device, the previous converter will be the first slave device. For the third slave device, the previous converter will be the second slave device and so on, for each slave device.

Once a DH, LX or DL connected signal is detected at the $PH_{IN}$ pin, the first subsequent rising edge of the master clock signal starts the internal clock of the slave device. Alternatively, the falling edge of the master clock signal may be used. For all the converters, the DH and LX output is synchronized with the rising edge of the internal clock of the slave device. Therefore, when the first slave device detects a DH, LX or DL signal from the master device, the first slave device internal clock starts and a DH signal is seen by the second slave device such that, the next subsequent rising edge of the master clock starts the internal clock of the second slave device. The DH and DL signal of each slave device is then used to drive a MOSFET transistor pair, such that each pair is driven out of phase.

BRIEF DESCRIPTION OF DRAWINGS

These and other object, features and characteristics of the present invention will become more apparent to those skilled in the art from a study of the following detailed description in conjunction with the appended claims and drawings, all of which form a part of this specification. In the drawings:

DETAILED DESCRIPTION OF PRESENTLY PREFERRED EXEMPLARY EMBODIMENTS

The present invention provides an improved method and apparatus to synchronize multiple switching regulators in out of phase mode without a phase locked loop. By synchronizing multiple switching regulators, the present invention may be used to reduce electronic noise levels generated by the switching regulators or confine the noise to known non-sensitive frequency bands. Once confined the noise may be eliminated through the use of effective noise filters. An additional benefit to operating synchronized regulators in out of phase mode is the reduction of the ripple current requirement from the supply feeding the regulators.

Figure 1:
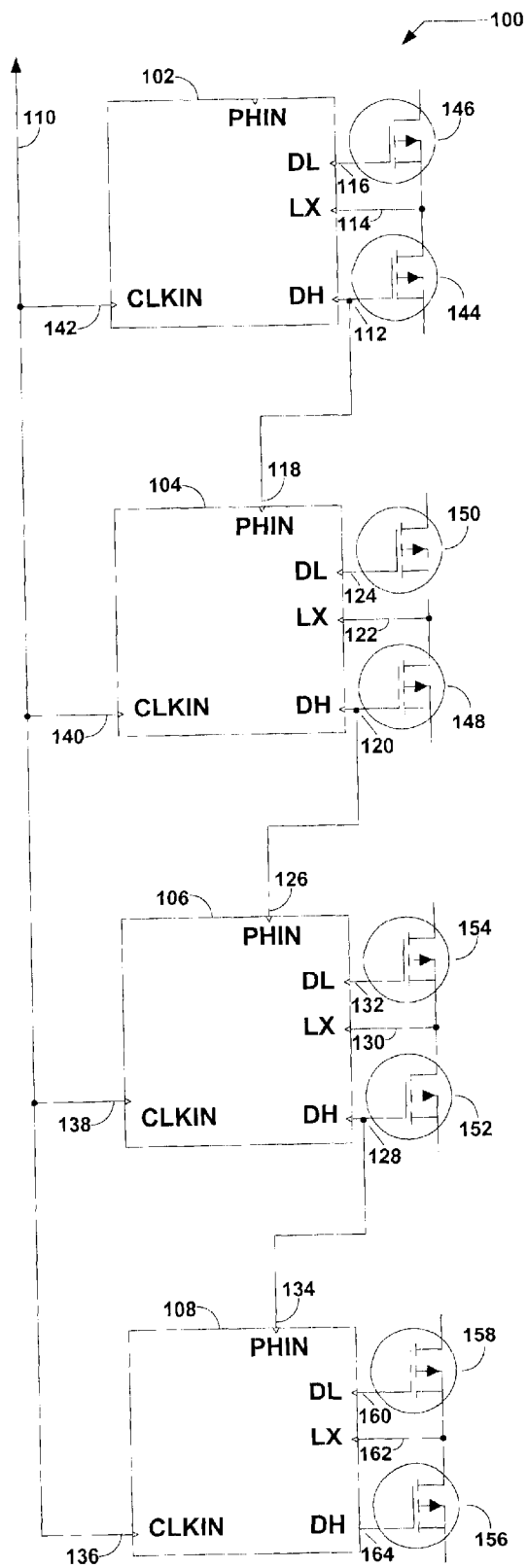
FIG. 1 illustrates an embodiment of the present invention in which a master device is connected to multiple slave devices.

In FIG. 1, an illustrative circuit of the present invention is shown. A number of switching regulator circuits are shown electrically coupled in series such that a first switching regulator acts as a master device to each subsequent electrically coupled switching regulator. Each subsequent regulator acts a slave device, responding to an signal derived from the previous device. Each switching regulator is shown electrically coupled to two switching elements, a main switch MOSFET and a synchronous switch MOSFET, electrically coupled in series and providing drain to source voltage sensing feedback.

Figure 2:
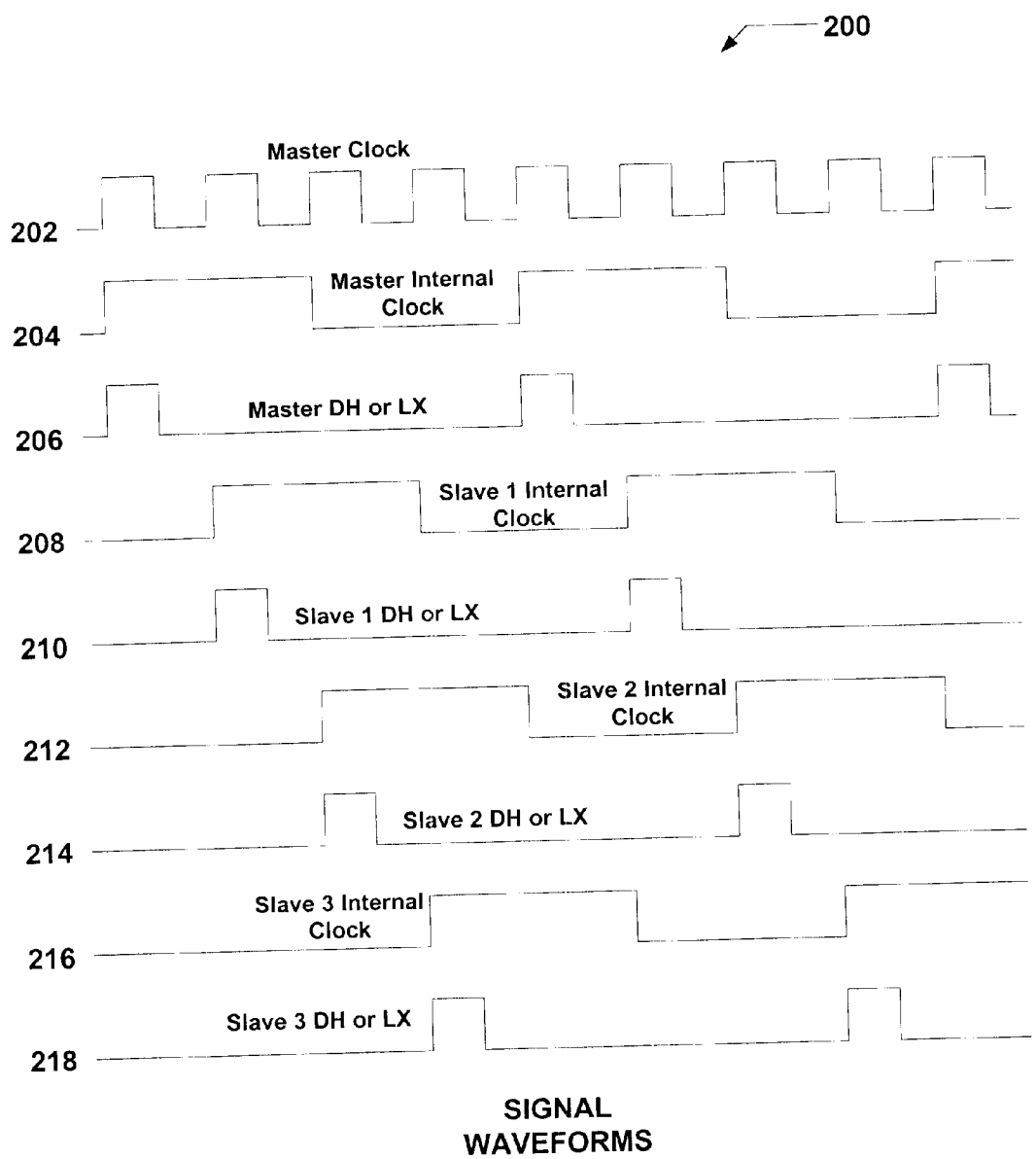
FIG. 2 illustrates a plot of clock responses in accordance with the embodiment of the present invention.

In FIG. 1, circuit 100 includes a master device 102, and multiple slave devices 104, 106 and 108. The master device 102 includes a clock intput pin $CLK_{IN}$ 142, a DH pin 112, an LX pin 114 and a DL pin 116. The clock input pin $CLK_{IN}$ 142 of the master device 102 is electrically coupled to a clock bus 110 which is electrically coupled to the $CLK_{IN}$ pin of each slave device and provides a master clock signal. The master clock waveform is shown in FIG. 2 at 202. When a device detects an initialization signal via pin $PH_{IN}$, the first subsequent rising edge of the master clock waveform starts the device internal clock, shown as internal clock waveforms 204, 208, 212 and 216 in FIG. 2. The present invention is shown in use with the rising edge of the master clock waveform, alternatively the falling edge of the master clock waveform may be used.

The DH pin 112, LX pin 114 and DL pin 116 of the master device 102 are electrically coupled to a MOSFET transistor pair 144 and 146, which are electrically coupled in series. The DH pin 112 is used to drive the main switch MOSFET 144 and the DL pin 116 is used to drive the synchronous switch MOSFET 146 such that when the main switch is ON, the synchronous switch is OFF and vice versa. The LX pin 114 is electrically coupled to the drain/source series coupling of MOSFETs 144 and 146 and senses the drain to source voltage value. The drain to source voltage value is then used to set the duty cycle of the switching regulator.

The DH pin 112 is also electrically coupled to the $PH_{IN}$ pin 118 of the first slave device 104 and serves to initialize the following device based upon a DH output signal from the previous device. As stated earlier, when a device detects an initialization signal via pin $PH_{IN}$, the first subsequent rising edge of the master clock waveform 202 starts the device internal clock, shown as internal clock waveforms 204, 208, 212 and 216 in FIG. 2. Therefore when a preceding device drives the coupled synchronous switch MOSFET via pin DH, the DH pulse shown as pulse waveforms 206, 210, 214 and 218, the following device detects the pulse at pin $PH_{IN}$. Once the DH pulse from the preceding device is detected, the first subsequent rising edge of the master clock waveform 202 starts the device internal clock. In the case of the master device 102, the master device internal clock 204 is started upon the first rising edge of the master clock waveform 202.

The first slave device 104 is shown following the master device and includes a clock input pin $CLK_{IN}$ 140, a DH pin 120, an LX pin 122, a DL pin 124 and a $PH_{IN}$ pin 118. The clock input pin $CLK_{IN}$ 140 of the first slave device 104 is electrically coupled to the clock bus 110 which provides the device the master clock signal used in synchronization.

The DH pin 120, LX pin 122 and DL pin 124 of the fist slave device 104 are electrically coupled to another MOSFET transistor pair 148 and 150, which are electrically coupled in series. As with the master device 102, the DH pin 120 is used to drive the main switch MOSFET 148 and the DL pin 124 is used to drive the synchronous switch MOSFET 150 such that when the main switch is ON, the synchronous switch is OFF and vice versa. The DH pin 120 is also electrically coupled to the $PH_{IN}$ pin 126 of the second slave device 106 and serves to initialize the following device based upon a DH output signal. The LX pin 122 is electrically coupled to the drain/source series coupling of MOSFETs 148 and 150. As with the master device, a drain to source voltage value is sensed by the LX pin and is used to set the duty cycle of the switching regulator.

The second slave device 106 includes a clock input pin $CLK_{IN}$ 138, a DH pin 128, an LX pin 130, a DL pin 132 and a $PH_{IN}$ pin 126. The clock input pin $CLK_{IN}$ 138 of the second slave device 106 is electrically coupled to the clock bus 110 which provides the second slave device the master clock signal used in synchronization.

The DH pin 128, LX pin 130 and DL pin 132 of the second slave device 106 are electrically coupled to another MOSFET transistor pair 152 and 154, which are also electrically coupled in series. As with the master device 102 and the first slave device 104, the DH pin 128 is used to drive the main switch MOSFET 152 and the DL pin 132 is used to drive the synchronous switch MOSFET 154 such that when the main switch is ON, the synchronous switch is OFF and vice versa. The DH pin 128 is also electrically coupled to the $PH_{IN}$ pin of the third slave device 108 and serves to initialize the following device based upon a DH output signal. The LX pin 122 is electrically coupled to the drain/source series coupling of MOSFETs 152 and 154. As with the master device and the first slave device, a drain to source voltage value is sensed by the LX pin and is used to set the duty cycle of the switching regulator.

The third slave device 108 and additional slave devices utilized are configured in an identical fashion, each coupled to a MOSFET transistor pair and the clock bus 110. Proper synchronization also requires the coupling of the $PH_{IN}$ pin as with the master and first and second slave devices. In FIG. 1, the circuit is shown with single master device and three slave devices, however this configuration may be repeated for additional slave devices.

The internal clock for each slave device is held low until the $PH_{IN}$ pin for the slave device detects a falling edge of the DH output from the previous regulator. The embodiment shown uses the falling edge of the DH waveform, however either the rising or falling edge of any one of the DH, LX or DL outputs may be used. For the first slave device, the previous regulator will be the master device and for the second slave device, the previous regulator will be the first slave device. For the third slave device, the previous regulator will be the second slave device and so on, for each slave device.

Once the $PH_{IN}$ pin of a device detects the falling edge of the DH signal, the first subsequent rising edge of the master clock detected from the clock bus 110 starts the internal clock of the slave device. The present embodiment uses the rising edge of the master clock waveform, alternatively the falling edge of the master clock waveform may be used. For each regulator, the DH output signal 206, 210, 214 or 218, is synchronized with the rising edge of the internal clock of the device 204, 208, 212 or 216 respectively. Therefore, when a slave device internal clock starts, a DH signal is generated by the device and is seen by the following slave device such that, the next subsequent rising edge of the master clock starts the internal clock of the following slave device.

FIG. 2 illustrates the synchronization of the slave and master devices. In FIG. 2, the master clock signal is shown at waveform 202. Since the DH output signal is synchronized with the rising edge of the device internal clock 204, the DH output signal 206 of the master device 102 goes high when the internal clock 204 of the master device goes high.

The first slave device 104, coupled to the master device 102, sees the DH signal 206 of the master device go high and thereafter the first subsequent rising edge of the master clock 202 starts the internal clock 208 of the first slave device 104. Since the DH output signal 210 of the first slave device is synchronized with the rising edge of the device internal clock 208, the DH output signal 210 of the first slave device 104 goes high when the internal clock 208 of the first slave device goes high.

The second slave device 106, coupled to the first slave device 104, then sees the DH signal 210 of the first slave device go high and thereafter the first subsequent rising edge of the master clock 202 starts the internal clock 212 of the second slave device 106. Since the DH output signal 214 of the second slave device is synchronized with the rising edge of the device internal clock 212, the DH output signal 214 goes high when the internal clock 212 of the second slave device goes high.

The third slave device 108, coupled to the second slave device 106, then sees the DH signal 214 of the second slave device go high and thereafter the first subsequent rising edge of the master clock 202 starts the internal clock 216 of the third slave device 108. The synchronization illustrated is not restricted to the slave devices shown and may be repeated for even larger numbers of additionally coupled slave devices.

Another embodiment of the present invention teaches the use of the falling edge of the master clock such that each slave device, once detecting a DH or LX output from the previous device, awaits the first falling edge of the master clock which starts the slave device internal clock. Still another embodiment of the present invention teaches the use of either rising or falling edges of either LX or DH output signals.

We claim:

1. An electrical apparatus to synchronize multiple switching regulator devices in an out of phase mode comprising:
   a. a master device, said master device having a $CLK_{IN}$, DH, LX, and DL pin, said $CLK_{IN}$ pin electrically coupled to a clock bus, said DH pin electrically coupled to a first MOSFET transistor, said LX pin electrically coupled to a first drain-source coupling and said DL pin electrically coupled to a second MOSFET transistor, said DH pin further electrically coupled to a first slave device;
   b. a first slave device, said first slave device having a $CLK_{IN}$, DH, LX, DL and $PH_{IN}$ pin, said $CLK_{IN}$ pin electrically coupled to said clock bus, said DH pin electrically coupled to a third MOSFET transistor, said LX pin electrically coupled to a second drain-source coupling and said DL pin electrically coupled to a fourth MOSFET transistor, said DH pin further electrically coupled to a second slave device;
   c. a second slave device, said second slave device having a $CLK_{IN}$, DH, LX, DL and $PH_{IN}$ pin, said $CLK_{IN}$ pin electrically coupled to said clock bus, said DH pin electrically coupled to a fifth MOSFET transistor, said LX pin electrically coupled to a third drain-source coupling and said DL pin electrically coupled to a sixth MOSFET transistor, said DH pin further electrically coupled to a third slave device;
   d. a third slave device, said third slave device having a $CLK_{IN}$, DH, LX, DL and $PH_{IN}$ pin, said $CLK_{IN}$ pin electrically coupled to said clock bus, said DH pin electrically coupled to a seventh MOSFET transistor, said LX pin electrically coupled to a fourth drain-source coupling and said DL pin electrically coupled to a eighth MOSFET transistor; and
   e. a clock bus connected to clock input terminals of the master device and plurality of slave devices, said clock bus transmitting a master clock signal.

2. An electrical apparatus as recited in claim 1 wherein said first, third, fifth and seventh MOSFET transistors are main switch MOSFETs.

3. An electrical apparatus as recited in claim 1 wherein said second, fourth, sixth and eighth MOSFET transistors are synchronous switch MOSFETs.

4. An electrical apparatus as recited in claim 1 wherein said first, second, third and fourth drain-source couplings provide drain to source voltage measurements to said master, first, second and third slave devices, said measurements used by said master, first, second and third slave devices to determine a duty cycle for said MOSFETs.

5. An electrical apparatus as recited in claim 1 wherein said first MOSFET is driven by said master device when said master device detects a rising edge of said master clock, said second MOSFET driven by said master device alternate to said first MOSFET based on said duty cycle for said first and second MOSFETs.

6. An electrical apparatus as recited in claim 1 wherein said third, fifth and seventh MOSFETs are driven by said first, second and third slave devices when said slave devices detect a rising edge of said master clock after sensing an output signal from a prior slave device, said master device prior to said first slave device, said first device prior to said second slave device, and said second slave device prior to said third slave device.

7. An electrical apparatus as recited in claim 1 wherein said fourth, sixth and eighth MOSFETs are driven by said first, second and third slave devices alternate to said third, fifth and seventh MOSFETs based on said duty cycle for said third and fourth, fifth and sixth, and seventh and eighth MOSFETs.

8. An apparatus as recited in claim 1 wherein said master device and said first, second and third slave devices are switching regulators, said switching regulators synchronizing said MOSFET driving out of phase.

9. A method of synchronizing multiple devices in an out of phase mode comprising the steps of:

a. connecting a plurality of switching regulators in series, each regulator having a $CLK_{IN}$, DH, LX, DL, and $PH_{IN}$ pin, said plurality having a master regulator and sequentially numbered slave regulators;

b. connecting a master clock signal to said $CLK_{IN}$ pin of each regulator of said plurality;

c. activating said master regulator upon sensing a rising edge of said master clock signal, said activation of said master regulator driving a first power MOSFET pair;

d. connecting a first terminal of said master regulator to said $PH_{IN}$ pin of said first slave regulator, said first slave regulator activated upon sensing a rising edge of said master clock signal following an input at said $PH_{IN}$ pin of said first slave regulator, said activation of said first slave regulator driving a second power MOSFET pair;

e. connecting a first terminal of said first slave regulator to said $PH_{IN}$ pin of said second slave regulator, said second slave regulator activated upon sensing a rising edge of said master clock signal following an input at said $PH_{IN}$ pin of said second slave regulator, said activation of said second slave regulator driving a third power MOSFET pair;

f. connecting a first terminal of said second slave regulator to said $PH_{IN}$ pin of said third slave regulator, said third slave regulator activated upon sensing a rising edge of said master clock signal following an input at said $PH_{IN}$ pin of said third slave regulator, said activation of said third slave regulator driving a fourth power MOSFET pair; and g. said activation of said master regulator and first, second and third slave regulators synchronizing said driving of said first, second, third and fourth MOSFET pairs out of phase.

10. The method of synchronizing multiple devices as recited in claim 9 wherein said first terminal is said DH terminal.

11. The method of synchronizing multiple devices as recited in claim 9 wherein said first terminal is said LX terminal.

12. The method of synchronizing multiple devices as recited in claim 9 wherein said rising edge of said master clock signal is replaced with a falling edge of said master clock signal.

* * * * *